United States Patent
Nagata et al.

(10) Patent No.: US 9,155,227 B2
(45) Date of Patent: Oct. 6, 2015

(54) ROTARY ENCODER

(75) Inventors: Hiroshi Nagata, Chiyoda-ku (JP);
Toshikazu Satone, Chiyoda-ku (JP);
Yoichi Omura, Chiyoda-ku (JP);
Takashi Okamuro, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 270 days.

(21) Appl. No.: 13/979,679

(22) PCT Filed: Feb. 9, 2011

(86) PCT No.: PCT/JP2011/052789
§ 371 (c)(1),
(2), (4) Date: Jul. 15, 2013

(87) PCT Pub. No.: WO2012/108021
PCT Pub. Date: Aug. 16, 2012

(65) Prior Publication Data
US 2013/0294031 A1 Nov. 7, 2013

(51) Int. Cl.
*G01B 7/30* (2006.01)
*H05K 7/20* (2006.01)
*G01B 21/00* (2006.01)
(Continued)

(52) U.S. Cl.
CPC ............... *H05K 7/2039* (2013.01); *G01B 7/30* (2013.01); *G01B 11/26* (2013.01); *G01B 21/00* (2013.01); *G01D 5/24433* (2013.01); *G01D 11/245* (2013.01)

(58) Field of Classification Search
CPC .......... G01B 7/30; G01B 21/00; G01B 11/26; H05K 7/20; H05K 7/2039
USPC .................................................. 33/1 PT, 534
See application file for complete search history.

(56) References Cited

U.S. PATENT DOCUMENTS 5,801,530 A    9/1998  Crosby et al.
7,825,367 B2 * 11/2010 Nakamura et al. ............ 33/1 PT
(Continued)

FOREIGN PATENT DOCUMENTS

CN   101416571 A   4/2009
JP   04-203358 A   7/1992
(Continued)

OTHER PUBLICATIONS

Communication dated Dec. 16, 2014, issued by the State Intellectual Property Office of the People's Republic of China in corresponding Chinese Application No. 201180067291.0.
(Continued)

*Primary Examiner* — Yaritza Guadalupe-McCall
(74) *Attorney, Agent, or Firm* — Sughrue Mion, PLLC

(57) ABSTRACT

A rotary encoder includes a rotary encoding unit attached to a rotary shaft which is rotatably held in a metal casing, a number-of-revolution detection unit supported by the metal casing for detecting a number of revolutions of the rotary encoding unit and producing heat, a cylindrical insulating resin cover having a base end attached to the metal casing for accommodating therein the rotary encoding unit and the number-of-revolution detection unit, a metal lid for blocking an opening of the other end of the insulating resin cover, and a shield cable electrically connected to the number-of-revolution detection unit and drawn out from a cable outlet of the metal lid. A shield of the shield cable is heat-transferably and electrically connected to the metal lid.

5 Claims, 5 Drawing Sheets

(51) Int. Cl.
*G01B 11/26* (2006.01)
*G01D 5/244* (2006.01)
*G01D 11/24* (2006.01)

(56) References Cited

U.S. PATENT DOCUMENTS

| | | | |
|---|---|---|---|
| 7,939,796 B2 | 5/2011 | Satone et al. | |
| 7,958,620 B2 * | 6/2011 | Henshaw | 33/534 |
| 8,001,700 B2 | 8/2011 | Tondorf et al. | |
| 8,056,250 B2 * | 11/2011 | Yanata | 33/550 |
| 8,138,468 B2 * | 3/2012 | Maeda | 33/1 PT |
| 2008/0047151 A1 * | 2/2008 | Davidson | 33/1 PT |
| 2008/0120850 A1 * | 5/2008 | Brandl | 33/1 PT |
| 2008/0120851 A1 * | 5/2008 | Brandl | 33/1 PT |
| 2009/0141276 A1 | 6/2009 | Tondorf et al. | |
| 2010/0148044 A1 | 6/2010 | Satone et al. | |

FOREIGN PATENT DOCUMENTS

| | | |
|---|---|---|
| JP | 05-240606 A | 9/1993 |
| JP | 08-004640 A | 1/1996 |
| JP | 09-222467 A | 8/1997 |
| JP | 2008-020417 A | 1/2008 |
| JP | 2009-073314 A | 4/2009 |
| JP | 2009-139377 A | 6/2009 |
| JP | 2009-168610 A | 7/2009 |
| JP | 2010-002324 A | 1/2010 |
| WO | 2007/116801 A1 | 10/2007 |

OTHER PUBLICATIONS

Taiwanese Office Action, dated Feb. 21, 2014, Application No. 100116622.

\* cited by examiner

ROTARY ENCODER

CROSS REFERENCE TO RELATED APPLICATIONS

This is a National Stage of International Application No. PCT/JP2011/052789, filed Feb. 9, 2011, the contents of all of which are incorporated herein by reference in their entirety.

FIELD

The present invention relates to a rotary encoder that detects the number of revolutions of a rotary shaft of a motor and the like.

BACKGROUND

Conventionally, an encoder is disclosed in which a scanning constitution unit includes a main unit that supports a scanning plate and can be mounted by the main unit to an object to be measured, and heat of electric constituent elements of the scanning constitution unit is transferred from an internal space to a contact surface outside of a contact element (a cover) by a heat transfer element through a heat transfer path, and in which when the scanning constitution unit is mounted on the object to be measured, the contact surface makes close contact with the object to be measured, which functions as a heat sink, thereby dissipating the heat of the electric constituent elements to the object to be measured (see, for example, Patent Literature 1).

CITATION LIST

Patent Literature

Patent Literature 1: Japanese Patent Application Laid-open No. 2009-139377

SUMMARY

Technical Problem

According to the above conventional technique, it is possible to dissipate the heat generated by the electric constituent elements of the encoder to the object to be measured, which functions as a heat sink, via the heat transfer element and the contact element (a lid). However, in a general encoder that detects the number of revolutions of a rotary shaft, because a cover that covers the electric constituent elements does not make any contact with the object to be measured, there is a problem that it is difficult to dissipate the heat of the electric constituent elements.

The present invention has been achieved in view of the above problem, and an object of the present invention is to provide a rotary encoder that can dissipate heat of electric constituent elements.

Solution to Problem

The present invention is directed to a rotary encoder that solves the problem. The rotary encoder includes a rotary encoding unit attached to a rotary shaft which is rotatably held in a metal casing; a number-of-revolution detection unit supported by the metal casing for detecting a number of revolutions of the rotary encoding unit and producing heat; a cylindrical insulating resin cover having a base end attached to the metal casing for accommodating therein the rotary encoding unit and the number-of-revolution detection unit; a metal lid for blocking an opening of the other end of the insulating resin cover; and a shield cable electrically connected to the number-of-revolution detection unit and drawn out from a cable outlet of the metal lid, a shield thereof being heat-transferably and electrically connected to the metal lid.

Advantageous Effects of Invention

The rotary encoder according to the present invention can dissipate heat generated by a number-of-revolution detection unit from a metal lid to a shield of a shield cable.

DESCRIPTION OF EMBODIMENTS

Exemplary embodiments of a rotary encoder according to the present invention will be explained below in detail with reference to the accompanying drawings. The present invention is not limited to the embodiments.

First Embodiment

Figure 1:
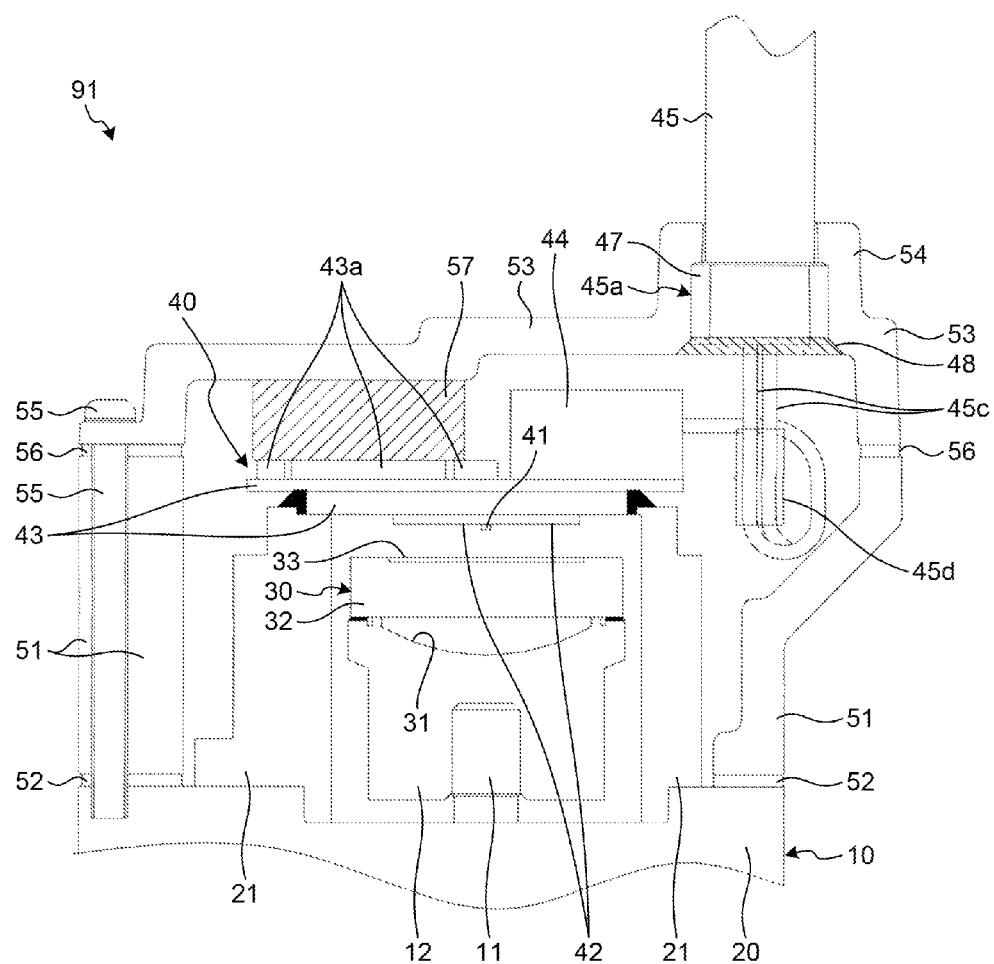
FIG. 1 is a vertical cross-sectional view of a rotary encoder according to a first embodiment of the present invention.
Figure 2:
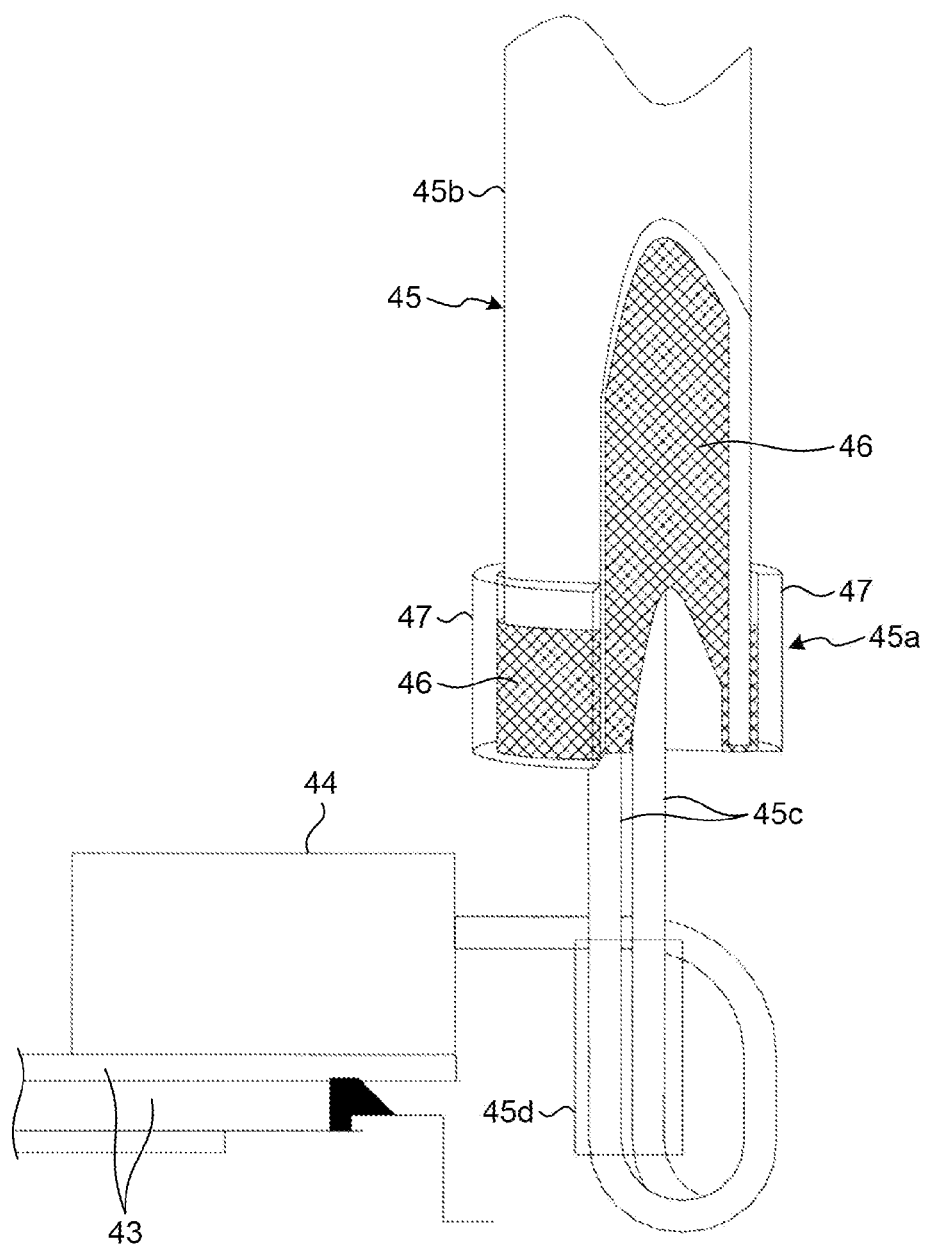
FIG. 2 is a partial cutaway enlarged view of a base end part of a shield cable.

FIG. 1 is a vertical cross-sectional view of a rotary encoder according to a first embodiment of the present invention. FIG. 2 is a partial cutaway enlarged view of a base end part of a shield cable. As shown in FIG. 1, a rotary encoder 91 according to the first embodiment is attached to a metal casing 20 of a motor 10 (specifically, a motor bracket on an opposite load side opposite to a load side). A rotary shaft 11 of the motor 10 is rotatably held in the metal casing 20.

A rotary encoding unit 30 is attached to the rotary shaft 11 via a boss 12. The rotary encoding unit 30 includes a mirror 31 and a rotary encoding plate 32 having an optical pattern unit 33. Furthermore, in the metal casing 20, a number-of-revolution detection unit 40 that detects the number of revolutions of the rotary encoding unit 30 is supported via a housing 21 that accommodates therein the rotary encoding unit 30. The number-of-revolution detection unit 40 includes a light projection unit 41, a light reception unit 42, and a circuit board 43 having mounted thereon an electronic circuit that processes an electric signal photoelectrically converted by the light reception unit 42 and electronic components 43a that produce heat.

A base end of a cylindrical insulating resin cover 51 that accommodates therein the rotary encoding unit 30 and the number-of-revolution detection unit 40 are attached to a peripheral part of the metal casing 20 via a packing 52. An opening of the other end of the insulating resin cover 51 is blocked by a metal lid 53.

Because the circuit board 43 of the number-of-revolution detection unit 40 is accommodated in the insulating resin cover 51, even when an edge part of the circuit board 43 is positioned nearer to the insulating resin cover 51, an insulating distance from the metal lid 53 can be maintained, and the number of the electronic components 43a to be mounted on the circuit board 43 can be increased by enlarging the area of the circuit board 43.

A shield cable 45, which is electrically connected to the circuit board 43 by signal lines 45c and a connector 44 and outputs an electric signal processed by the number-of-revolution detection unit 40 outside (specifically, to an amplifier), is drawn out from a cable outlet 54 of the metal lid 53. The plural signal lines 45c are bundled by a heat shrinkable tube 45d.

The metal lid 53 has the connector 44 accommodated therein, and is connected mechanically, heat-transferably, and electrically to the metal casing 20 along with the insulating resin cover 51 by a metal screw 55. A packing 56 is sandwiched between the metal lid 53 and the other end of the insulating resin cover 51. A heat transfer material 57 having elasticity of a silicon rubber type is sandwiched between the electronic components 43a of the number-of-revolution detection unit 40 that produce heat and the metal lid 53. The heat transfer material 57 is pressed by the electronic components 43a and the metal lid 53.

By interposing the heat transfer material 57 between the electronic components 43a that produce heat and the metal lid 53, heat of the electronic components is swiftly dissipated to the metal lid 53. The heat transfer material 57 is not essential. Heat transfer from the electronic components 43a that produce heat to the metal lid 53 may be heat radiation or heat transfer by air.

As shown in FIG. 2, a base end part 45a of the shield cable 45 that is positioned in the cable outlet 54 of the metal lid 53 has a shield 46 exposed by peeling off an insulation coating 45b. The base end part 45a is circularly caulked by a caulker 47. The base end part 45a of the shield cable 45 having the caulker 47 attached thereto is press-fitted in the cable outlet 54 of the metal lid 53, and the shield 46 is connected heat-transferably and electrically to the metal lid 53.

With this configuration, heat generated by the electronic components 43a of the number-of-revolution detection unit 40 that produce heat is dissipated to the shield 46 from the metal lid 53. The shield 46 functions as a heat sink. The caulked base end part 45a of the shield cable 45 is adhered to the metal lid 53 by an adhesive 48 for waterproof function and prevention of falling off.

Furthermore, because a tip end of the shield 46 is grounded and the metal casing 20 is grounded on a side thereof where a device is attached, the metal lid 53 is grounded on both sides of the shield cable 45 and the metal casing 20. Therefore the reliability of the grounding is high.

An operation of the rotary encoder 91 according to the first embodiment is explained next. Light emitted from the light projection unit 41 passes through the rotary encoding plate 32 and is reflected by the mirror 31. A part of the light is blocked by the optical pattern unit 33 on the rotary encoding plate 32. The light having passed through the rotary encoding plate 32 is then received by the light reception unit 42, photoelectrically converted, processed as an electric signal by the electronic circuit of the circuit board 43, and output by the shield cable 45.

The heat generated by the number-of-revolution detection unit 40 is transferred to the metal lid 53, and then dissipated from the metal lid 53 to the shield 46 of the shield cable 45. Subsequently, the heat is transferred from the metal lid 53 to the metal screw 55, and then dissipated from the metal screw 55 to the metal casing 20. Furthermore, the metal lid 53 is grounded on both sides of the shield 46 of the shield cable 45 and the metal casing 20.

Second Embodiment

Figure 3:
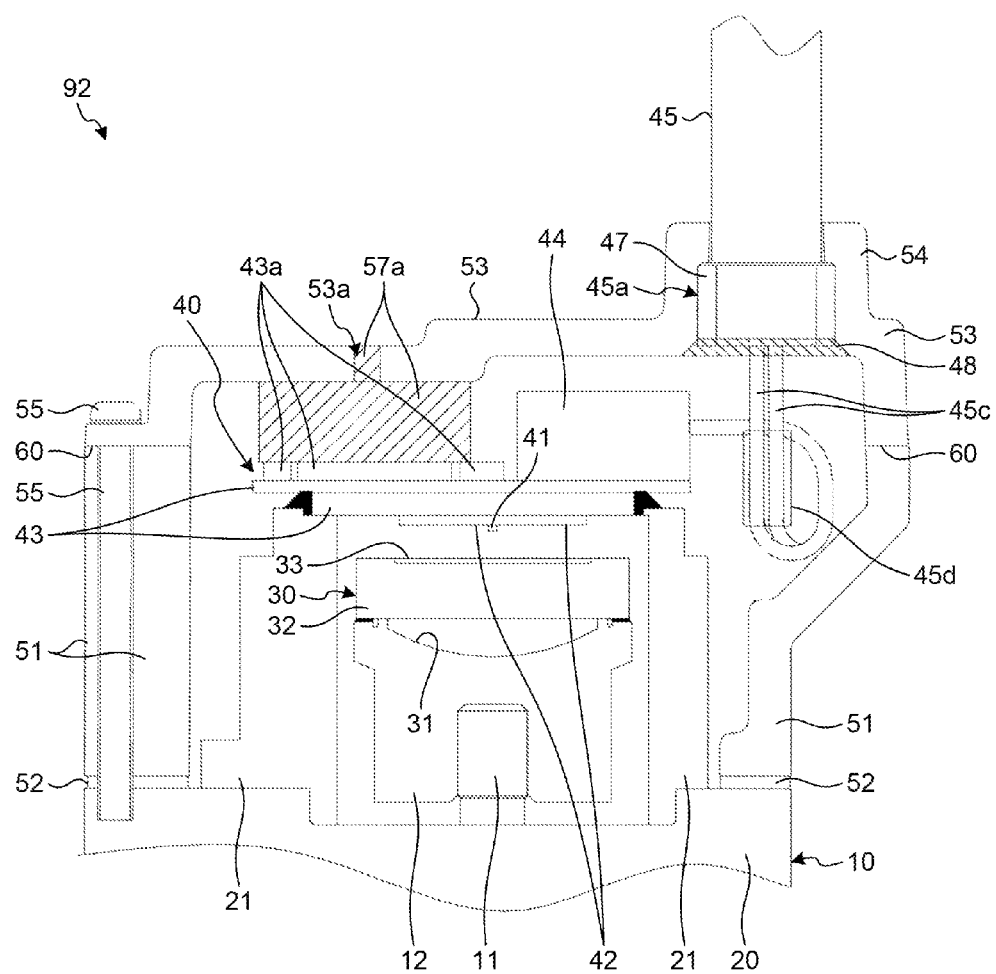
FIG. 3 is a vertical cross-sectional view of a rotary encoder according to a second embodiment of the present invention.

FIG. 3 is a vertical cross-sectional view of a rotary encoder according to a second embodiment of the present invention. In FIG. 3, elements identical to those shown in FIG. 1 are denoted by like reference signs and explanations thereof will be omitted, and elements different from those of the first embodiment are explained.

As shown in FIG. 3, in a rotary encoder 92 according to the second embodiment, the other end of the insulating resin cover 51 and the metal lid 53 are joined by a nano-mold 60. That is, nano-level irregularities are formed on a surface of the metal lid 53, and resin of the insulating resin cover 51 is joined to the irregularities with a hook structure. A highly rigid cover structure can be achieved by the nano-mold 60. The metal lid 53 and the insulating resin cover 51 can be joined by integrated molding, instead of the nano-mold 60.

Furthermore, in the rotary encoder 92 according to the second embodiment, gel silicon 57a is injected as a heat transfer material between the metal lid 53 and the electronic components 43a, from an injection port 53a that is provided in the metal lid 53, instead of the heat transfer material 57 of a silicon rubber type in the rotary encoder 91 according to the first embodiment. The gel silicon 57a has high heat transfer effect because the gel silicon 57a penetrates even to gaps between the electronic components 43a.

Third Embodiment

Figure 4:
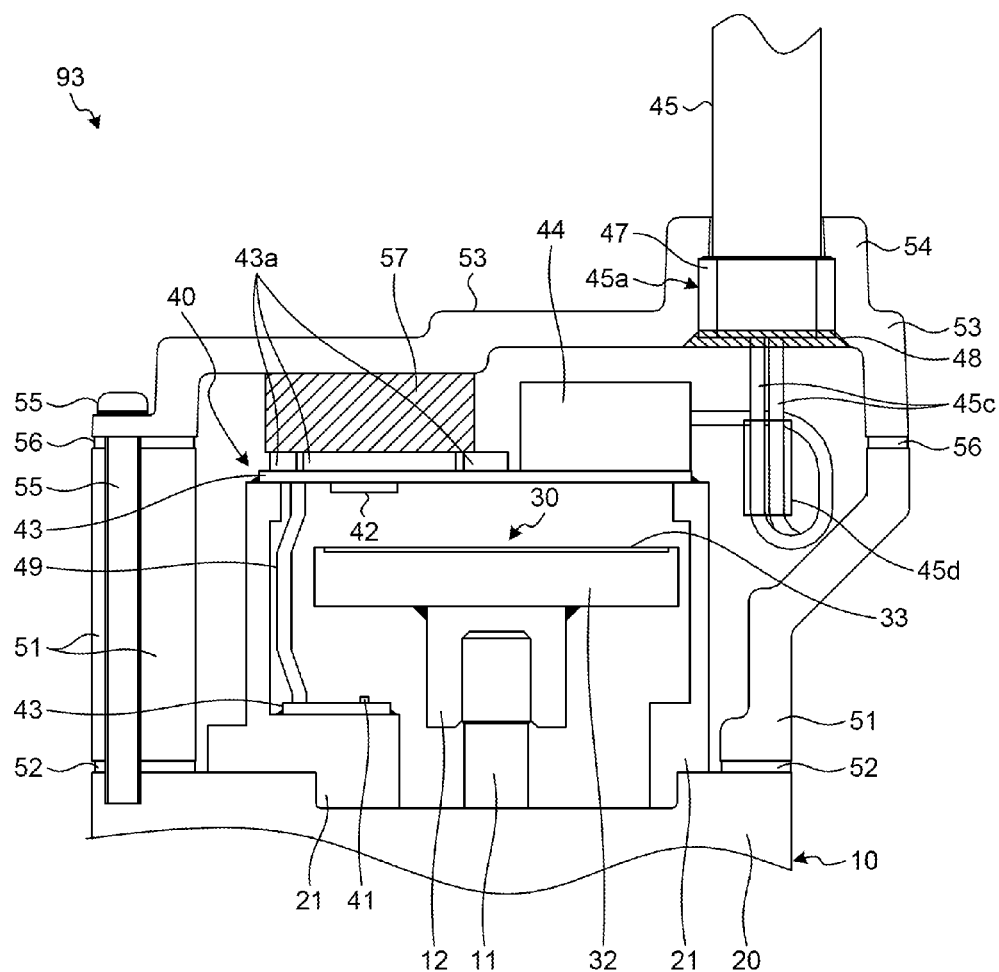
FIG. 4 is a vertical cross-sectional view of a rotary encoder according to a third embodiment of the present invention.

FIG. 4 is a vertical cross-sectional view of a rotary encoder according to a third embodiment of the present invention. In FIG. 4, elements identical to those shown in FIG. 1 are denoted by like reference signs and explanations thereof will be omitted, and elements different from those of the first embodiment are explained.

As shown in FIG. 4, in a rotary encoder 93 according to the third embodiment, the light reception unit 42 is positioned on the circuit board 43 having the electronic components 43a that produce heat mounted thereon, while the light projection unit 41 is positioned on the circuit board 43 arranged on a base part of the housing 21 on a side of the metal casing 20. The light projection unit 41 and the light reception unit 42, sandwiching the rotary encoding plate 32, are opposed to each other. The circuit board 43 having the electronic components 43a that produce heat mounted thereon and the circuit board 43 arranged on a base part of the housing 21 on the side of the metal casing 20 are connected by an electric wire 49.

Light emitted from the light projection unit 41 passes through the rotary encoding plate 32. A part of the light is blocked by the optical pattern unit 33 on the rotary encoding plate 32. The light is then received by the light reception unit 42, photoelectrically converted, processed as an electric signal by the electronic circuit of the base plate 43, and output by the shield cable 45.

Similarly to the rotary encoder 91 according to the first embodiment, the heat generated by the number-of-revolution detection unit 40 is transferred to the metal lid 53, and then dissipated from the metal lid 53 to the shield 46 (see FIG. 2) of the shield cable 45.

Subsequently, the heat is transferred from the metal lid 53 to the metal screw 55, and then dissipated from the metal screw 55 to the metal casing 20. Furthermore, the metal lid 53 is grounded on both sides of the shield 46 of the shield cable 45 and the metal casing 20.

Fourth Embodiment

Figure 5:
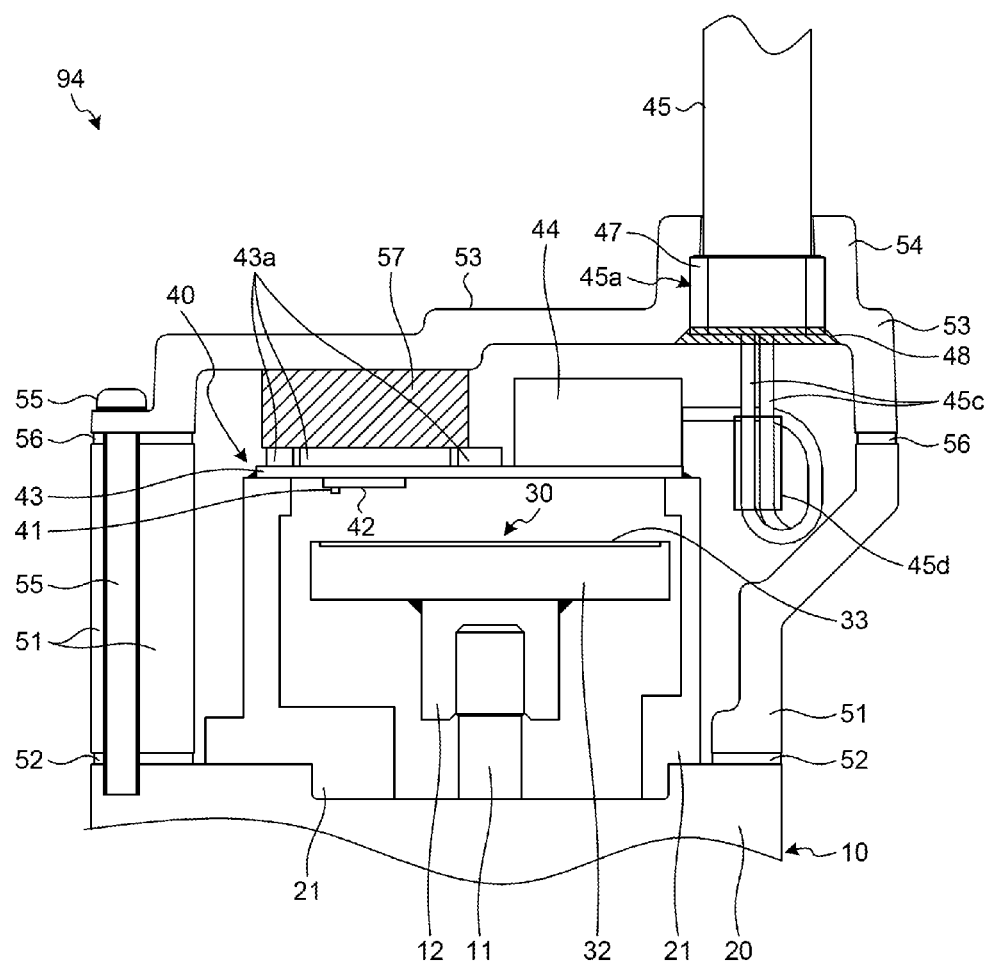
FIG. 5 is a vertical cross-sectional view of a rotary encoder according to a fourth embodiment of the present invention.

FIG. 5 is a vertical cross-sectional view of a rotary encoder according to a fourth embodiment of the present invention. In FIG. 5, elements identical to those shown in FIG. 1 are denoted by like reference signs and explanations thereof will be omitted, and elements different from those of the first embodiment are explained.

As shown in FIG. 5, in a rotary encoder 94 according to the fourth embodiment, the light projection unit 41 and the light reception unit 42 are arranged on an edge part of the circuit board 43 having the electronic components 43a that produce heat mounted thereon, and are arranged to oppose an edge part of the rotary encoding plate 32.

A part of light emitted from the light projection unit 41 is reflected by the optical pattern unit 33 on the rotary encoding plate 32. The light is then received by the light reception unit 42, photoelectrically converted, processed as an electric signal by the electronic circuit of the base plate 43, and output by the shield cable 45.

Similarly to the rotary encoder 91 according to the first embodiment, the heat generated by the number-of-revolution detection unit 40 is transferred to the metal lid 53, and then dissipated from the metal lid 53 to the shield 46 (see FIG. 2) of the shield cable 45.

Subsequently, the heat is transferred from the metal lid 53 to the metal screw 55, and then dissipated from the metal screw 55 to the metal casing 20. Furthermore, the metal lid 53 is grounded on both sides of the shield 46 of the shield cable 45 and the metal casing 20.

INDUSTRIAL APPLICABILITY

As described above, the rotary encoder according to the present invention is useful as a rotary encoder for a small motor in which electronic components that produce heat are mounted in high density and a heat dissipating area of a metal lid is small.

REFERENCE SIGNS LIST

10 motor
11 rotary shaft
12 boss
20 metal casing
21 housing
30 rotary encoding unit
31 mirror
32 rotary encoding plate
33 optical pattern unit
40 number-of-revolution detection unit
41 light projection unit
42 light reception unit
43 circuit board
43a electronic component
44 connector
45 shield cable
45a base end part
45b insulation coating
45c signal line
45d heat shrinkable tube
46 shield
47 caulker
48 adhesive
49 electric wire
51 insulating resin cover
52 packing
53 metal lid
54 cable outlet
55 metal screw
56 packing
57 heat transfer material
57a gel silicon (heat transfer material)
60 nano-mold
91, 92, 93, 94 rotary encoders

The invention claimed is:

1. A rotary encoder comprising:
a rotary encoding unit attached to a rotary shaft which is rotatably held in a metal casing;
a number-of-revolution detection unit supported by the metal casing for detecting a number of revolutions of the rotary encoding unit and producing heat;
a cylindrical insulating resin cover having a base end attached to the metal casing for accommodating therein the rotary encoding unit and the number-of-revolution detection unit;
a metal lid for blocking an opening of the other end of the insulating resin cover; and
a shield cable electrically connected to the number-of-revolution detection unit and drawn out from a cable outlet of the metal lid, a shield thereof being heat-transferably and electrically connected to the metal lid.

2. The rotary encoder according to claim 1, wherein the metal lid is mechanically, heat-transferably, and electrically connected to the metal casing along with the insulating resin cover by a metal screw, and is grounded on both sides of the shield of the shield cable and the metal casing.

3. The rotary encoder according to claim 1, further comprising a heat transfer material interposed between the number-of-revolution detection unit and the metal lid.

4. The rotary encoder according to claim 3, wherein the heat transfer material is gel silicon.

5. The rotary encoder according to claim 1, wherein the insulating resin cover and the metal lid are joined by a nano-mold or integrated molding.

* * * * *